(12) United States Patent
Côté et al.

(10) Patent No.: US 6,807,663 B2
(45) Date of Patent: Oct. 19, 2004

(54) ACCELERATED LAYOUT PROCESSING USING OPC PRE-PROCESSING

(75) Inventors: Michel Luc Côté, San Jose, CA (US); Christophe Pierrat, Santa Clara, CA (US); Philippe Hurat, San Jose, CA (US)

(73) Assignee: Numerical Technologies, Inc., Mountain View, CA (US)

( * ) Notice: Subject to any disclaimer, the term of this patent is extended or adjusted under 35 U.S.C. 154(b) by 0 days.

(21) Appl. No.: 10/253,204

(22) Filed: Sep. 23, 2002

(65) Prior Publication Data

US 2004/0060034 A1 Mar. 25, 2004

(51) Int. Cl.[7] .............................................. G06F 17/50
(52) U.S. Cl. .............................. 716/21; 716/20; 716/21
(58) Field of Search ........................ 716/19–21, 8–11, 716/17, 2–9, 12–14; 430/5, 322; 438/129; 703/4, 14, 5

(56) References Cited

U.S. PATENT DOCUMENTS

| | | | |
|---|---|---|---|
| 5,631,110 A | 5/1997 | Shioiri et al. .................. 430/5 |
| 5,682,323 A | * 10/1997 | Pasch et al. .................. 716/19 |
| 5,723,233 A | 3/1998 | Garza et al. .................... 430/5 |
| 5,815,685 A | 9/1998 | Kamon ....................... 395/500 |
| 5,825,647 A | 10/1998 | Tsudaka ................ 364/167.03 |
| 5,991,006 A | 11/1999 | Tsudaka ....................... 355/53 |
| 6,014,456 A | 1/2000 | Tsudaka ...................... 382/144 |
| 6,081,658 A | 6/2000 | Rieger et al. .......... 395/500.22 |
| 6,154,563 A | 11/2000 | Tsudaka ...................... 382/144 |
| 6,171,731 B1 * | 1/2001 | Medvedeva et al. ........... 430/5 |
| 6,194,252 B1 * | 2/2001 | Yamaguchi ................. 438/129 |
| 6,243,855 B1 | 6/2001 | Kobayashi et al. ........... 716/19 |
| 6,249,597 B1 | 6/2001 | Tsudaka ...................... 382/144 |
| 6,263,299 B1 * | 7/2001 | Aleshin et al. ................. 703/5 |
| 6,289,499 B1 | 9/2001 | Rieger et al. ................. 716/21 |
| 6,298,473 B1 | 10/2001 | Ono et al. ..................... 716/21 |
| 6,370,679 B1 * | 4/2002 | Chang et al. ................. 716/19 |
| 6,446,248 B1 * | 9/2002 | Solomon et al. ............. 716/17 |
| 6,453,457 B1 | 9/2002 | Pierrat et al. ................. 716/19 |
| 6,560,766 B2 * | 5/2003 | Pierrat et al. ................. 716/19 |

(List continued on next page.)

FOREIGN PATENT DOCUMENTS

| | | |
|---|---|---|
| GB | 2324169 A | 10/1998 |
| JP | 3-80525 | 4/1991 |
| WO | WO 00/67074 A1 | 11/2000 |

OTHER PUBLICATIONS

Sanie, M. et al., "Malhotra, V.;Practical application of full–feature alternating phase–shifting technology for a phase–aware standard–cell design flow", Design Automation Conference, 2001. Proceedings , Jun. 18–22, 2001 pp.: 93–96.*

(List continued on next page.)

*Primary Examiner*—Vuthe Siek
*Assistant Examiner*—Naum Levin
(74) *Attorney, Agent, or Firm*—Bever, Hoffman & Harms, LLP; Jeanette S. Harms

(57) ABSTRACT

Performing optical proximity correction (OPC) is typically done during a critical time, wherein even small delays in finishing OPC can have significant adverse effects on product introduction and/or market exposure. In accordance with one feature of the invention, sets of repeating structures in library elements and/or layout data can be identified during a non-critical time, e.g. early in cell library development, possibly years prior to the direct application of OPC to a final layout. OPC can be performed on repeating structures during this non-critical time. Later, during the critical time (e.g. during tape out), an OPC tool can use the pre-processed structures in conjunction with a chip layout to more quickly generate a modified layout, thereby saving valuable time as a chip moves from design to production.

26 Claims, 3 Drawing Sheets

U.S. PATENT DOCUMENTS

| | | | | |
|---|---|---|---|---|
| 6,687,895 B2 | * | 2/2004 | Zhang | 716/19 |
| 2002/0045136 A1 | * | 4/2002 | Fritze et al. | 430/322 |
| 2002/0100004 A1 | | 7/2002 | Pierrat et al. | 716/5 |
| 2002/0157068 A1 | * | 10/2002 | LaCour et al. | 716/3 |
| 2003/0018948 A1 | * | 1/2003 | Chang et al. | 716/8 |
| 2003/0074646 A1 | * | 4/2003 | Kotani et al. | 716/19 |
| 2003/0079196 A1 | * | 4/2003 | Altfeld et al. | 716/12 |
| 2004/0019869 A1 | * | 1/2004 | Zhang | 716/11 |

OTHER PUBLICATIONS

Ackmann, P.. et al., "Phase Shifting and Optical Proximity Corrections to Improve CD Control on Logic Devices in Manufacturing for Sub 0.35 um 1–Line". SPIE, vol. 3051, pp. 146–153, Mar. 12–14, 1997.

Lithas. "Lithas: Optical Proximity Correction Software" (2 pages).

Precim, "Proxima System", Precim Company, Portland, Oregon (2 pages).

Precim, "Proxima Wafer Proximity Corecction System". Precim Company, Portland, Oregon (2 pages).

Rieger, M., et al., "Mask Fabrication Rules for Proximity–Corrected Patterns", Precim Company, Portland, Oregon (10 pages).

Rieger, M., et al., "Using Behavior Modeling for Proximity Correction". Precim Company, Portland, Oregon (6 pages).

Cobb. et al., "Fast Sparse Aerial Image Calculation for OPC", SPIE, vol. 2621, pp. 534–544, Sep. 20–22, 1995.

Lucas, K., et al., "Model Based OPC for 1st Generation 193nm Lithography", Motorola Inc.. IDT assignee to IMEC (12 pages).

Stirniman, J., et al., "Quantifying Proximity and Related Effects in Advanced Wafer Processes", Precim Compnay, Hewlett Packard Labs (9 pages).

Sugawara, M.. et al., "Practical Evaluation of Optical Proximity Effect Correction by EDM Methodology", Sony Corporation (11 pages).

Saleh, B., et al., "Reduction of Errors of Microphotographic Reproductions by Optimal Corrections of Original Masks", Optical Engineering, vol. 20, No. 5, pp. 781–784, Sep./Oct. 1981.

Fu, C.C., et al., "Enhancement of Lithographic Patterns by Using Serif Features", IEEE, Transactions On Electron Devices, vol. 38, No. 12, pp. 2599–2603, Dec. 1991.

Harafuji, K.. et al., "A Novel Hierarchical Approach for Proximity Effect Correction in Electron Beam Lithography", IEEE, vol. 12, No. 10, pp. 1508–1514, Oct. 1993.

Rieger, M., et al., "System for Lithography Proximity Compensation", Precim Company, Portland, Oregon, Sep. 1993 (28 pages).

Stirniman, J.. et al., "Fast Proximity Correction with Zone Sampling", SPIE, vol. 2197, pp. 294–301 (1994).

Stirniman, J., et al., "Optimizing Proximity Correction for Wafer Fabrication Processes", SPIE, Photomask Technology And Management, vol. 2322, pp. 239–246 (1994).

Stirniman, J., et al., "Wafer Proximity Correction and Its Impact on Mask–Making", Bacus News, vol. 10, Issue 1, pp. 1, 3–7, 10–12, Jan. 1994.

Henderson, R.. et al., "Optical Proximity Effect Correction: An Emerging Technology", Microlithography World, pp. 6–12 (1994).

Barouch, E., et al., "Optimask: An OPC Algorithm for Chrome and Phase–Shift Mask Design", SPIE, Vo. 2440, pp. 192–206, Feb. 1995.

Cobb, N., et al., "Fast, Low–Complexity Mask Design", SPIE, vol. 2440, pp. 313–327, Feb. 22–24, 1995.

Yen, A., et al., "Characterization and Correction of Optical Proximity Effects in Deep–Ultraviolet Lithography Using Behavior Modeling", J. Vac. Sci. Technol. B, vol. 14, No. 6, pp. 4175–4178, Nov./Dec. 1996.

Morimoto, H., et al., "Next Generation Mask Strategy—Technologies are Ready for Mass Production of 256MDRAM?", SPIE, vol. 3236, pp. 188–189 (1997).

Park, C., et al., "An Automatic Gate CD Control for a Full Chip Scale SRAM Device", SPIE, vol. 3236, pp. 350–357 (1997).

Dolainsky, C.., et al., "Application of a Simple Resist Model to Fast Optical Proximity Correction". SPIE, vol. 3051, pp. 774–780 (1997).

Chuang, II., et al., "Practical Applications of 2–D Optical Proximity Corrections for Enhanced Performance of 0.25um Random Logic Devices", IEEE, pp. 18.7.1–18.7.4, Dec. 1997.

Cobb, N., et al., "Experimental Results on Optical Proximity Correction With Variable Threshold Resist Model". SPIE, vol. 3051, pp. 458–468, Mar. 12–14, 1997.

Asai, N.. et al., "Proposal for the Coma Aberration Dependent Overlay Error Compensation Technology", Jpn. J. Appl. Phys., vol. 37, pp. 6718–6722 (1998).

Cobb, N., "Fast Optical and Process Proximity Correction Algorithms for Integrated Circuit Manufacturing", Dissertation, University of California at Berkeley, UMI Microform 9902038 (139 pages).

Toublan, O., et al., "Phase Aware Proximity Correction for Advanced Masks", SPIE, vol. 4000, pp. 160–170, Mar. 1–3, 2000.

Anonymous, "Modifying Traditional Model Optical Proximity Correction (MOPC) Flow To Include Mask Writer Issues", IPCOM000009586D, Sep. 4, 2002 (1 page).

Anonymous, "Parameterization For Full Shape And Rule Dependent Dissection", IPCOM000009587D, Sep. 4, 2002 (9 pages).

* cited by examiner

ACCELERATED LAYOUT PROCESSING USING OPC PRE-PROCESSING

BACKGROUND OF THE INVENTION

1. Field of the Invention

The invention relates to design layout processing, and in particular to using pre-processed structures to accelerate optical proximity correction (OPC) of the design layout.

2. Description of the Related Art

Optical proximity correction (OPC) applies systematic changes to geometries of a layout to improve the printability of a wafer pattern. Specifically, as the size of integrated circuit features drops to $0.18\mu$ and below, the features can become smaller than the wavelength of the light used to create such features, thereby creating optical distortions when printing the features onto the wafer. These optical distortions can represent significant impacts on device performance.

Rule-based OPC can include rules to implement certain changes to the layout, thereby compensating for some optical distortions. For example, to compensate for line-end shortening, rule-based OPC can add a hammerhead to a line end. Additionally, to compensate for corner rounding, rule-based OPC can add serif shapes to outer corners or subtract serif shapes from inner corners. These changes can form features on the wafer that are closer to the original intended layout.

In model-based OPC, a real pattern transfer can be simulated (i.e. predicted) with a set of mathematical formulas (i.e. models). In model-based OPC, the edges of a feature in a layout can be dissected into a plurality of segments, thereby allowing these segments to be individually moved to correct for proximity effects. The placement of the dissection points is determined by the feature shape, size, and/or position relative to other features, by simulation, or wafer results. Dissection points can also be determined by exploring the proximity behavior along the edges. In some embodiments, a fixed dissection length can be used for edges, e.g. every N nm. In other embodiments, multiple dissection lengths are provided, e.g. inner corner, outer corner, etc.

FIG. 1 illustrates a simplified flow chart for standard OPC processing. Specifically, in step 101, a chip layout can be received. In one embodiment, the data input format of the layout can include hierarchical information, i.e. information organized into a hierarchy of cells, each cell containing a portion of the layout data. In such an embodiment, hierarchical information can be "flattened" into shapes associated with a single layer of the chip. Alternatively, the hierarchy can be modified to account for proximity effects between different cells. This flattening or modifying facilitates shape identification, which can be used when performing OPC in step 102. A modified chip layout can be output in step 103.

Step 102 can include rule-based OPC, model-based OPC, or a hybrid of rule- and model-based OPC. In general, model-based OPC provides higher accuracy, but can take significantly more time to process the layout than rule-based OPC. In one embodiment of hybrid OPC, rule-based OPC is performed on predetermined locations on the layout and model-based OPC is performed on other locations. In this manner, hybrid OPC can provide an intermediate level of accuracy and processing time.

Typically, performing OPC is done toward the end of the chip design process. Thus, OPC can become a bottleneck for implementing a chip layout. Growing design sizes and increasing complexity of OPC methodologies can aggravate this problem. Thus, performing OPC can result in undesirable long runtimes as well as large disk/memory requirements.

Therefore, a need arises for increasing OPC speed and decreasing disk/memory requirements associated with OPC. Note that the term OPC as used herein can generically refer to proximity effect corrections, e.g. for resist, etch, and micro-loading.

SUMMARY OF THE INVENTION

Performing optical proximity correction (OPC) is typically done during tape out of the mask data needed to manufacture the integrated circuit. Unfortunately, this period can be extremely critical, wherein even small delays in finishing OPC can have significant adverse effects on product introduction and/or market exposure. In accordance with one feature of the invention, repeating structures in library elements (e.g. standard cells) and/or layout data (e.g. portions of a chip layout, IP cores, memory cells, and/or input/output blocks) can be identified during a non-critical time. Repeating structures can be defined as "static" structures having identical or substantially similar proximity effect (e.g. optical) environments. Static structures can be any structures that will not change during the chip design process. Therefore, OPC can also be performed on representative repeating structures during a non-critical time. In typical layouts, this pre-processing can provide OPC solutions for at least half of a design. Thus, using pre-processing can dramatically minimize any OPC impact on downstream scheduling for the integrated circuit.

Structures can be identified at micro and macro levels. For example, structures can include segments, shapes (i.e. portions of polygons), polygons, and group of polygons. In one embodiment, structures within an inner core of a cell can be analyzed. For example, the core can be defined as an area within a cell that is inward by a distance equal to the proximity effect range from the cell proximity effect boundary (i.e. the area around the cell that is guaranteed not to contain any shapes on the same layer from adjacent cells). In one embodiment of the invention, identification of the repeating structures and the pre-processing of representative repeating structures can be done during the creation of the library elements/layout data. In this manner, the structures and/or positions of the structures in the library elements/layout data can be modified, if possible, to maximize the number of repeating structures. In general, identification of the repeating structures and the pre-processing of representative repeating structures can be done whenever the resources needed to perform OPC (e.g. CPU or microprocessor time) are available.

Information regarding the pre-processed structures can be stored until needed. This information can include dissection and evaluation points for segments, contrast images at the evaluation points, and a corrected version of the structure. In one embodiment, the pre-processed structure information can be stored with the library element or layout data, e.g. as part of a layer of the hierarchy or on a layer dedicated to pre-processed structure information. In another embodiment, the pre-processed structure information could be kept in a separate data file associated with the library or layout data. In one implementation, the library elements, the layout data, and/or the pre-processed repeating structure information can be provided in GDS-II format.

Advantageously, after pre-processing a representative repeating structure in a set of repeating structures, other structures in the set can be instantiated (i.e. the OPC solution for the representative repeating structure can be copied at designated locations), thereby eliminating the need to compute the OPC for those other structures. Thus, an OPC tool can use the pre-processed structures in conjunction with a chip layout to quickly generate a modified layout, thereby saving valuable computing time. For example, in one embodiment, the pre-processed representative structures can be computed before instantiating them into the design. Moreover, because a chip layout typically includes multiple repeating structures, pre-processing also decreases data volume. Specifically, the instantiations create more hierarchical data, which take up significantly less volume than flat layout data.

DETAILED DESCRIPTION OF THE FIGURES

Chip layouts for integrated circuits can be intrinsically repetitive. Identifying repeating structures with the same (optical) proximity environment can be used in reducing the volume of information in the layout that needs to be processed. For example, once a repeating structure is identified, determining how to process that structure need only be done once. In some layouts, repeating structures could be instantiated hundreds of thousands of times. Thus, identifying repeating structures can dramatically reduce processing time of a layout.

In accordance with one feature of the invention, representative repeating structures can be pre-processed for optical proximity correction (OPC), thereby taking advantage of the repetitions in the layout. Advantageously, by limiting OPC computation to representative repeating structures and instantiating other repeating structures, process speed can be significantly increased while simultaneously decreasing disk/memory requirements. Moreover, because the repeating structures are static (that is, will not change during the chip design process), OPC processing can be performed earlier in the design process, thereby eliminating the bottleneck previously experienced.

Figure 1:
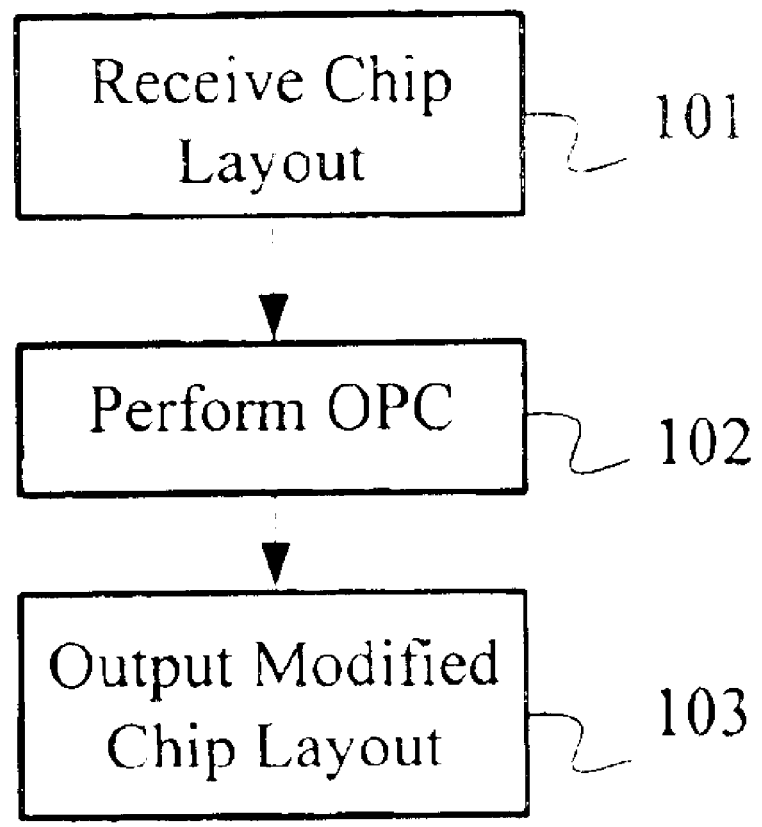
FIG. 1 illustrates a simplified flow chart for standard OPC processing.
Figure 2A:
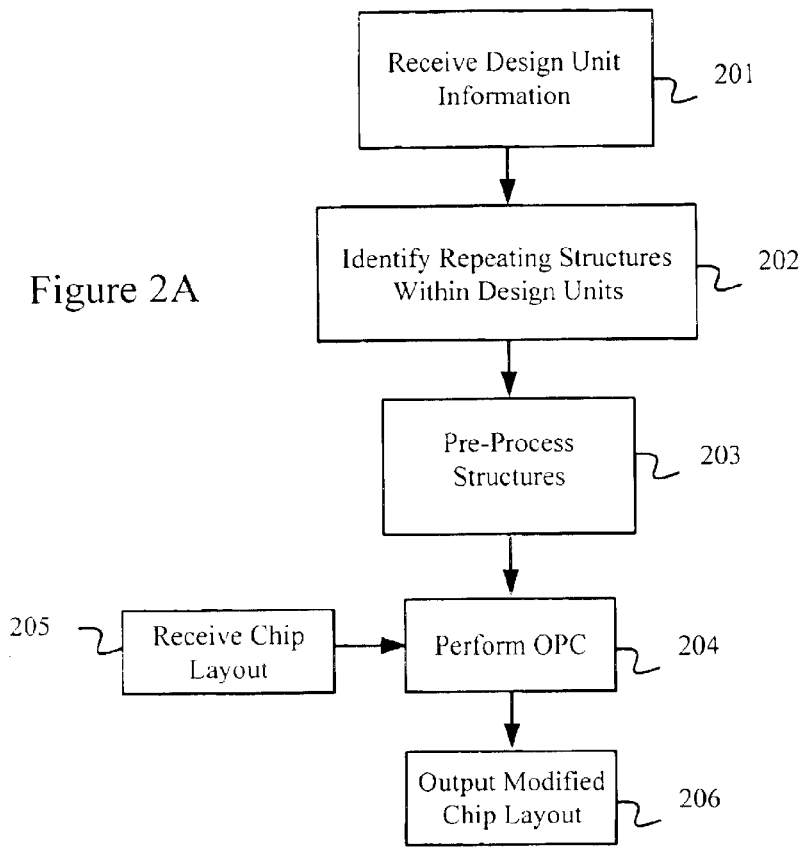
FIG. 2A illustrates an exemplary OPC flow including the pre-processing of repeating structures.

FIG. 2A illustrates an exemplary process flow including the pre-processing of repeating structures. In step 201 of the process flow, design unit information can be received. Design unit information can include library elements (e.g. standard cells, which are the fundamental building blocks of cell-based chip designs) and/or layout data (e.g. IP cores (pre-defined logic blocks providing specific functionality), memory cells, input/output (I/O) pads, data paths, any (e.g. custom) blocks). In one embodiment, standard cells can be developed by a layout creation tool receiving inputs including cell netlists, design rules, and layout requirements. An exemplary layout creation tool is the abraCAD™ tool, which is part of the Cadabra™ product line licensed by Numerical Technologies, Inc.

Figure 2B:
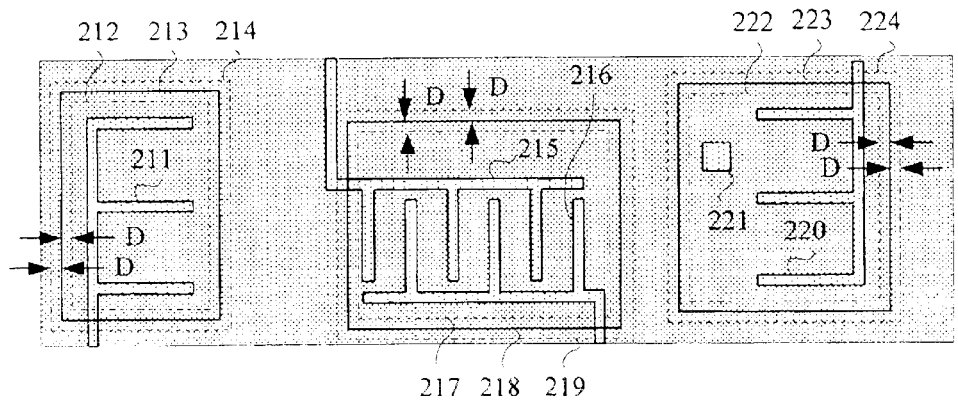
FIG. 2B illustrates three cells used in a layout, wherein structures within inner cores of the cells can be analyzed for repeating structures.

In step 202, repeating structures having the same or substantially the same proximity effect (e.g. optical) environment in one or more design units can be identified. Note that repeating structures can be identified at various levels of detail. For example, repeating structures can include segments (e.g. segments formed by model-based OPC dissection), shapes (e.g. defined portions of polygons), polygons, groups of polygons, or areas based on pre-defined perimeters. In one embodiment shown in FIG. 2B, structures within an inner core of a cell can be analyzed to determine if any are repeating. For example, FIG. 2B shows three cells 213, 218, and 223. The core can be defined as an area within a cell that is inward by a distance equal to the proximity effect range D from the cell proximity effect boundary (i.e. the area around the cell that is guaranteed not to contain any shapes on the same layer from adjacent cells). Thus, cells 213, 218, and 223 have proximity effect boundaries 214, 219, and 224, respectively, with corresponding cores of 212, 217, and 222, respectively. Cell 213 includes a structure 211, cell 218 includes structures 215 and 216, and cell 223 includes structures 220 and 221. Note that once cores 212, 217, and 222 are defined, the structures within the cores can then be analyzed for their proximity effect environments. For example, structures 211 and 220 may be repeating if they have the same proximity effect environment. In contrast, structures 211 and 216 may not be repeating if they have different proximity effect environments, e.g. isolated shapes (structure 211) versus shapes in close proximity to each other (structures 216 and 215). Note that the distance used can be a function of the proximity effect range (e.g. a multiple of the proximity effect range). For example, two times the proximity effect range may avoid "ripple effects" during OPC.

In one embodiment of the invention, identification of the repeating structures can be done after receiving the library elements/layout data. In another embodiment of the invention, identification of the repeating structures can be done during the creation of the library elements/layout data. In this manner, the structures themselves (e.g. segments, shapes, polygons, etc.) in the library elements/layout data can be modified, if possible (i.e. assuming functionality can be maintained) to increase the number of repeating structures. Moreover, the positions of the structures in the library elements/layout data can also be modified, thereby maximizing the number of repeating structures. For example, in one standard cell embodiment, repeating structures can be placed in the core of the standard cell and less static structures (i.e. structures that could change during the chip design process) can be placed in the perimeter (e.g. a border within 1 micron of the outer edge of the standard cell).

Note that identifying more macro level structures than micro level structures can increase processing efficiency. In other words, instantiating an OPC solution to a group of polygons could take significantly less time than instantiating an OPC solution to a group of segments. Therefore, moving as many repeating structures as possible to the cores of the standard cells also increases the probability that more macro level structures (e.g. groups of polygons) can be identified as repeating.

In accordance with one feature of the invention, a set of repeating structures has an identical or substantially similar optical environment. In this manner, an OPC solution for one structure in the set (called a representative repeating structure) can be advantageously applied to all structures in the set. Accordingly, the representative repeating structures can be pre-processed in step 203. In one embodiment, pre-processing can be performed at any time after the identification of repeating structures in step 202. In another embodiment, pre-processing (e.g. building a hierarchy within a cell) can be performed on the fly during identification.

Note that a chip design could precede tape out (and manufacturing) of the integrated circuit implementing that chip design by as much as two years. However, processing parameters can significantly change over that same time. Fabrication facilities generally calibrate their models to optimize process settings to increase yield. These calibrations can include information regarding the type and exposure of photoresist as well as the particular stepper being used. Thus, due to those and other technology advances, a calibrated OPC solution for a layout could change up to the point of manufacturing the integrated circuit.

Therefore, in one embodiment, pre-processing step 203 can be performed based on an optical model instead of a calibrated model. This early-stage pre-processing can provide intermediate OPC solutions, which when used with the chip layout (as received in step 205) to perform OPC in step 204 can significantly reduce the time to output the modified chip layout in step 206. In other words, if an intermediate OPC solution indicated that a segment should be moved by N microns, then the OPC performed in step 204 could start processing with this corrected distance, wherein N microns is probably relatively close to the final OPC solution for that segment. Using intermediate OPC solutions to facilitate convergence is described in U.S. patent application Ser. No. 10/098,714, filed on Mar. 15, 2002, and entitled "Using A Suggested Solution To Speed Up A Process For Simulating And Correcting An Integrated Circuit Layout", as well as U.S. patent application Ser. No. 10/098,713, also filed on Mar. 15, 2002, and entitled "Method And Apparatus For Identifying An Identical Cell In An IC Layout With An Existing Solution", both of which are incorporated by reference herein. Note that in another embodiment, OPC can be performed after the calibrated model is ready. However, pre-processing step 203 can still be performed before any critical time in the manufacturing cycle (e.g. tape out).

In accordance with one feature of the invention, the OPC solution can be calculated for the representative repeating structures in step 203 and instantiated for the rest of the repeating structures in their respective sets. Note that the instantiation can be performed as part of step 203 or step 204. OPC processing can be done by a software tool, such as the iN-Tandem™ tool licensed by Numerical Technologies, Inc., on representative embodiments.

Figure 3:
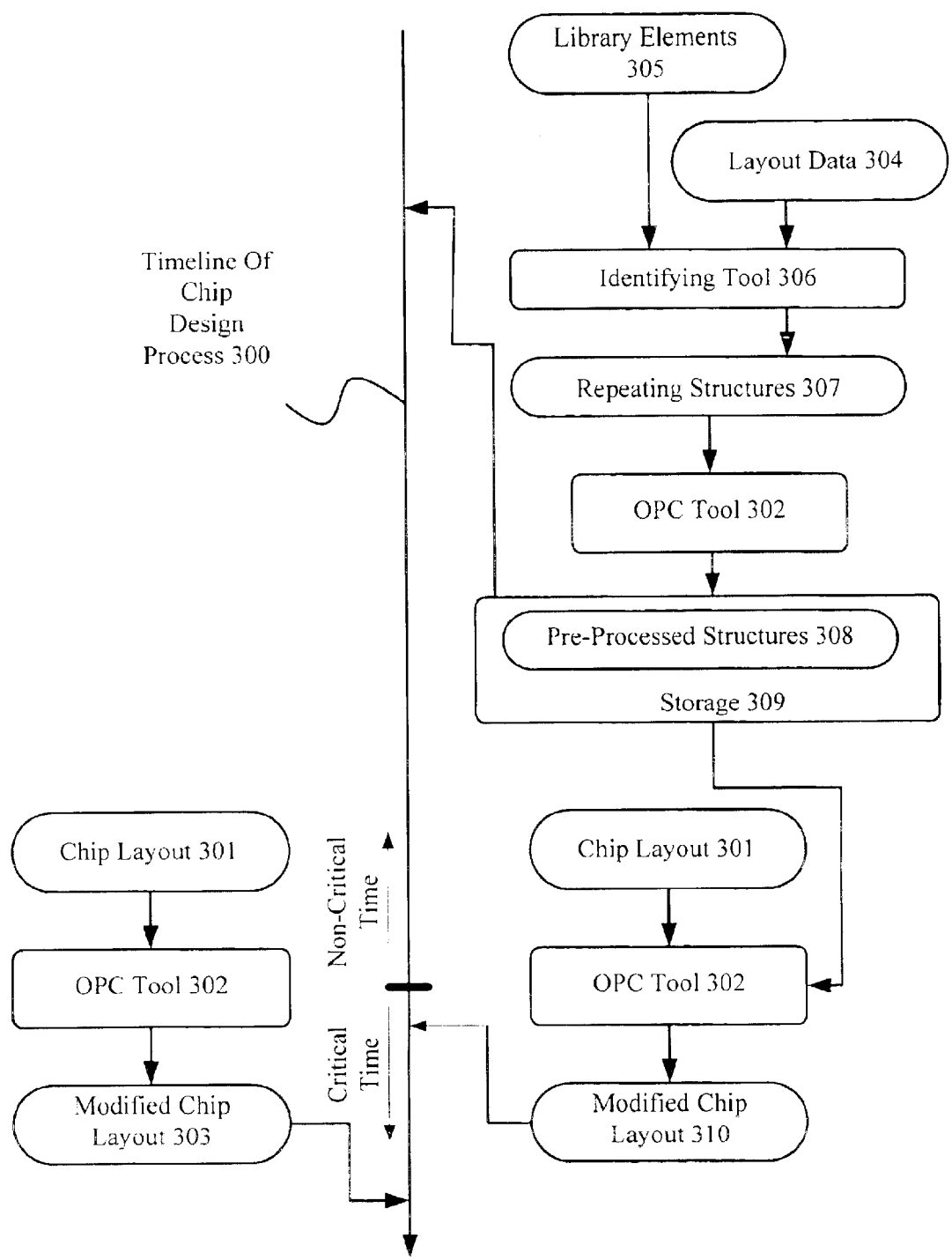
FIG. 3 illustrates a timeline of a chip design process. Using only a chip layout results in a modified layout being provided during a critical time. In contrast, using pre-processed structures in conjunction with the chip layout can result in the modified layout being provided during a non-critical time.

FIG. 3 illustrates a timeline 300 of a chip design process, wherein one side of timeline 300 refers to using only a standard chip layout and the other side of timeline 300 refers to using that chip layout in conjunction with the pre-processed structures. Specifically, referring to the left side, a standard chip layout 301 can be provided to an OPC tool 302. OPC tool 302 can then output a modified layout 303, which can be used during manufacturing of the chip. Note that modified layout 303 becomes available during a late period in timeline 300, which is a critical time in the design process.

In contrast, and referring to the right side of timeline 300, library elements 305 and/or layout data 304 (e.g. portions of a chip layout, IP cores, memory cells, input/output blocks, etc.) can be provided to an identifying tool 306. Identifying tool 306 can recognize repeating structures 307 in library elements 305/layout data 304. These repeating structures 307 can be provided to OPC tool 302. At this point, OPC tool 302 can generate pre-processed structures 308. These pre-processed structures 308 can be put into storage 309. In one embodiment, the information regarding pre-processed structures 308 could be placed on a separate hierarchy level within library elements 305 or layout data 304.

Information regarding the pre-processed structures could include, for example, dissection and evaluation points for segments, contrast images at the evaluation points, and a corrected version of the structure. In one embodiment, the pre-processed structure information can be stored with the library element or layout data, e.g. as part of a layer of the hierarchy or on a layer dedicated to pre-processed structure information. In another embodiment, the pre-processed structure information could be kept in a separate data file associated with the library or layout data. In one implementation, the library elements, the layout data, and/or the pre-processed repeating structure information can be provided in GDS-II format.

Of importance, pre-processed structures 308 can be made available during an early (i.e. non-critical) period in timeline 300. These pre-processed structures 308 (retrieved from storage 309) and chip layout 301 can be provided to a suitably modified OPC tool 302, which can then generate modified layout 310. Advantageously, modified layout 310 can be generated more rapidly than modified layout 303 using the prior art method, as shown by the arrow landing earlier in the critical time. Specifically, using pre-processed structures 308 allows OPC tool 302 to quickly converge to modified layout 310. Note that although identifying and pre-processing of the repeating structures can take place after library creation, library elements 305 may be generated by a software program that incorporates both identification and pre-processing in some embodiments.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, although the embodiments herein discuss identifying repeating structures in reference to OPC, this pre-processing can be equally applied to other processes (e.g. the placement of dissection and evaluation points). Additionally, the methods described herein can be applied to any lithographic process technology, including ultraviolet, deep ultraviolet (DUV), extreme ultraviolet (EUV), x-ray, electron projection lithography (EPL), and ebeam. Accordingly, it is intended that the scope of the invention be defined by the following Claims and their equivalents.

What is claimed is:

1. A method of minimizing time for performing optical proximity correction (OPC) on a chip layout, the method comprising:

identifying a set of repeating structures within defined design units, each instance of the repeating structures having substantially the same proximity effect environment within a predetermined distance;

pre-processing a representative repeating structure in the set of repeating structures during a non-critical time in chip design; and based on the pre-processing, performing the OPC on the chip layout.

2. The method of claim 1, wherein identifying includes accessing a library of standard cells.

3. The method of claim 1, wherein identifying includes receiving layout data.

4. The method of claim 1, wherein a defined design unit includes at least one of:
- a standard cell,
- an inner core of a standard cell,
- a memory cell,
- an input/output pad,
- an IP core,
- a data path, and
- a custom block.

5. The method of claim 1, wherein pre-processing is performed only on static structures.

6. The method of claim 1, wherein the non-critical time is after identifying but before OPC.

7. The method of claim 1, further including instantiating structures in the set of repeating structures before OPC.

8. The method of claim 1, wherein results of the pre-processing include at least one of dissection and evaluation points for segments, contrast images at the evaluation points, and corrected versions of the repeating structures.

9. The method of claim 1, wherein the predetermined distance is a function of the proximity effect range.

10. A method of designing a library of standard cells, the method comprising:
identifying repeating structures in at least one of the standard cells, wherein a set of repeating structures has substantially the same proximity effect environment within a predetermined range;
pre-processing one of the set of repeating structures for optical proximity correction during a non-critical time in chip design; and
storing results of the pre-processing.

11. The method of claim 10, wherein identifying can be done during creation of the standard cells, wherein the standard cells are optimized to maximize the occurrence of repeating structures.

12. The method of claim 10, wherein repeating structures can include at least one of segments, shapes, polygons, and groups of polygons.

13. The method of claim 10, wherein repeating structures can be grouped in the cores of the standard cells and other structures less static than the repeating structures can be placed in the perimeters of the standard cells.

14. The method of claim 10, wherein the results of the pre-processing include at least one of dissection and evaluation points for segments, contrast images at the evaluation points, and corrected versions of the repeating structures.

15. The method of claim 10, wherein storing the results can be done within a standard cell layout.

16. The method of claim 15, wherein the standard cell layout includes hierarchical data and the results are stored on a layer of the hierarchical data.

17. The method of claim 15, wherein the standard cell layout includes hierarchical data and the results are stored on a layer of the hierarchical data dedicated to the results.

18. The method of claim 10, wherein storing the results can include a separate data file associated with the library.

19. The method of claim 10, wherein the standard cells and the results of the pre-processing are provided in GDS-II format.

20. A storage means accessible by an optical proximity correction (OPC) tool, the storage means including:
pre-processed structures associated with a plurality of design units, wherein the pre-processed structures were created during a non-critical time in chip design, wherein each set of pre-processed structures has at least substantially the same proximity effect environment within a predetermined distance, and wherein the pre-processed structures can be used to perform OPC on a chip layout.

21. The storage means of claim 20 provided within at least one standard cell layout.

22. The storage means of claim 21, wherein the standard cell layout includes hierarchical data and the pre-processed structures are stored on one of a first layer with cell data and a second layer dedicated to the pre-processed structures.

23. The storage means of claim 20 provided in a separate data file associated with a standard cell library.

24. The storage means of claim 20 provided within layout data.

25. The storage means of claim 24, wherein the layout data includes hierarchical data and the pre-processed structures are stored on one of a first layer with a portion of the hierarchical data and a second layer dedicated to the pre-processed structures.

26. A method of minimizing time for performing a processing operation on a chip layout, the method comprising:
identifying a set of repeating structures within defined design units, each instance of the repeating structures having substantially the same proximity effect environment within a predetermined distance;
pre-processing a representative repeating structure in the set of repeating structures during a non-critical time in chip design; and
based on the pre-processing, performing the processing operation on the chip layout.

* * * * *